United States Patent
Takahashi et al.

(12)

(10) Patent No.: US 6,318,541 B1
(45) Date of Patent: *Nov. 20, 2001

(54) COMPONENT CARRYING DEVICE

(75) Inventors: Shigeki Takahashi; Nihei Kaishita; Akira Nemoto, all of Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/287,635

(22) Filed: Apr. 7, 1999

(30) Foreign Application Priority Data

Apr. 22, 1998 (JP) .................................. 10-111671

(51) Int. Cl.[7] .................................. B65G 25/04
(52) U.S. Cl. .......................................... 198/750.1
(58) Field of Search .............................. 198/750.1, 562, 198/540

(56) References Cited

U.S. PATENT DOCUMENTS

| | | | | |
|---|---|---|---|---|
| 2,629,504 | * | 2/1953 | Peterson | 198/750.2 |
| 2,991,872 | * | 7/1961 | Keegan | 198/220 |
| 4,162,724 | * | 7/1979 | Shinjo | 198/534 |
| 4,724,949 |  | 2/1988 | Misina . | |
| 4,948,322 |  | 8/1990 | Kunstmann . | |
| 5,503,299 |  | 4/1996 | Smith . | |
| 5,755,548 | * | 5/1998 | Gaasch et al. | 414/415 |
| 6,152,671 | * | 11/2000 | Kaishita et al. | 198/750.1 |

FOREIGN PATENT DOCUMENTS

| | | | |
|---|---|---|---|
| 8-048419 | 2/1996 | (JP) . | |
| 2000-16557 | * | 1/2000 | (JP) ............ B65G/27/12 |

OTHER PUBLICATIONS

Derwent Abstract Accession No. 2000–156302/14, V04, JP 2000016557 A (Murata Manufacturing) Jan. 18, 2000.

* cited by examiner

*Primary Examiner*—Donald P. Walsh
*Assistant Examiner*—Joe Dillon, Jr.
(74) *Attorney, Agent, or Firm*—Burns, Doane, Swecker & Mathis, LLP

(57) ABSTRACT

A component carrying device has a simple constitution, and is capable of lining up components and carrying them in one direction with high reliability. The device comprises a guide groove for lining up components into one line and guiding them; a carrying member, provided on the bottom face of the guide groove, which can move forward and backward along the direction of the groove; and driving means, for driving the carrying member forward and backward at a higher speed when moving backward than when moving forward. The speed of the carrying member when moving forward is a speed at which a predetermined sustained frictional force acts between the carrying member and the components, which are mounted on the top face of the carrying member; and the speed of the carrying member when moving backward is a speed at which the frictional force between the carrying member and the components mounted on its top face, substantially breaks, so that the components are carried forward by the difference in frictional force.

15 Claims, 5 Drawing Sheets

HEAD COMPONENT POSITION

START

ADVANCE AT LOW SPEED

DISTANCE MOVED

RETURN AT HIGH SPEED

COMPONENT CARRYING DEVICE

Priority is claimed under 35 U.S.C. § 119 to Japanese Patent Application No. 10-111671 filed in Japan on Apr. 22, 1998, the entire contents of which are herein incorporated by reference.

BACKGROUND OF THE INVENTION

1. Field of the Invention

The present invention relates to a component carrying device, and more particularly to a device for lining up components and carrying them intermittently.

2. Description of Related Art

Conventional carrying or conveying systems include a carrying system which provides downward-sloping grooves for carrying and guiding the components and drops the components using potential energy, a system using compressed air or negative pressure to convey components by air pressure, and a system comprising an unbroken belt on the bottom face of the grooves for carrying components, the components being carried by intermittently driving this belt (for instance, Japanese Unexamined Patent Publication No. 8-48419). These are known systems for carrying small-scale components such as chip components.

In the drop system, static electricity or dirt on the components sometimes causes the components to snag midway, leading to a problem of poor reliability. Furthermore, in the compressed air system, although the structure of the system is simple, it is susceptible to fluctuations in air pressure, and also requires a pressure source with the consequent disadvantage of high cost. Moreover, in the belt drive system, reliability is comparatively high but the drive mechanism for intermittently driving the belt is complex, tending to have poor durability.

SUMMARY OF THE INVENTION

Accordingly, it is an object of the present invention to provide a component carrying device which has a simple constitution and can eliminate problems such as those mentioned above.

In order to achieve the above objects, a first aspect of the present invention comprises a component carrying device comprising a guide groove for lining up components into one line and guiding them; a carrying member, provided on the bottom face of this guide groove, and movable forward and backward along the direction of the groove; and driving means, for driving the above carrying member forward and backward, the speed when moving backward being higher than when moving forward; the speed of the carrying member when moving forward is a speed at which a predetermined sustained frictional force acts between the carrying member and the components, which are mounted on the top face of the carrying member; and the speed of the carrying member when moving backward is a speed at which the frictional force between the carrying member and the components, mounted on its top face, is substantially overcome.

Other objects, features and advantages of the present invention will be explained with reference to exemplary embodiment shown in the accompanying drawing and described below.

DESCRIPTION OF THE PREFERRED EMBODIMENTS

Figure 1A:
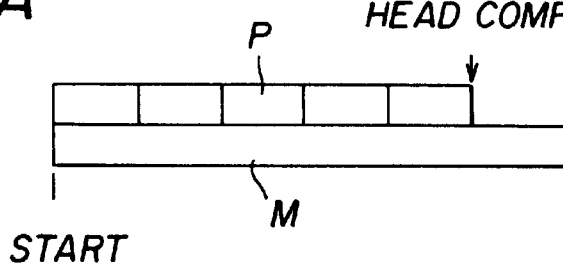
FIGS. 1A to 1C are explanatory diagrams showing operating principles of the component carrying device of the present invention.
Figure 1B:
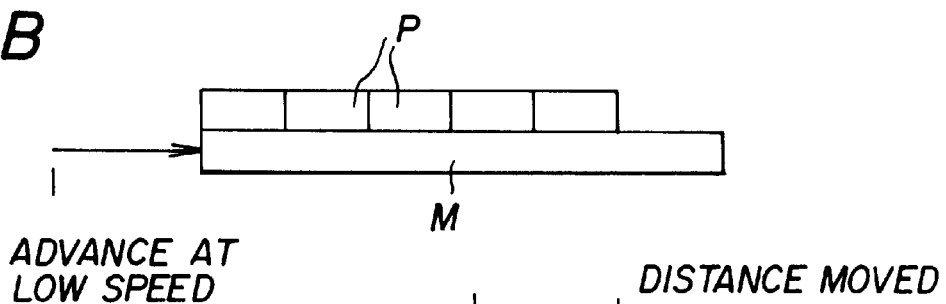
Figure 1C:
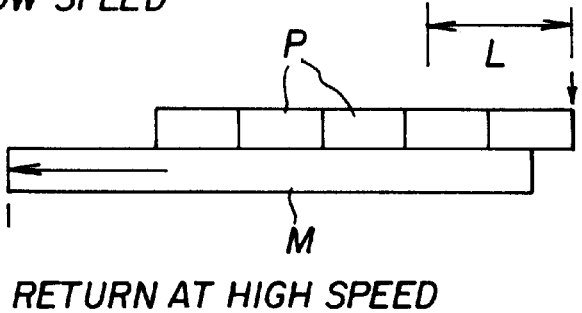

FIGS. 1A to 1C show operating principles of the component carrying device according to the present invention.

FIG. 1A shows the initial position, in which the side faces of components P are guided by a guide groove (not shown in the diagram) and lined up in one line. When a carrying member M, provided on the bottom face of the guide groove, is advanced at low speed. Components, which are mounted on the top face of the carrying member M, are carried forward together with the carrying member M as a result of sustained static frictional force acting between the carrying member M and the components P.

FIG. 1B shows a state when the carrying member M has reached the front end position. At this stage, there is no relative slip between the carrying member M and the components P.

FIG. 1C shows a state when the carrying member M is returned at high speed. The speed when returning is faster than when advancing, and is set so as to substantially break or overcome the static frictional force between the carrying member M and the components P. As a consequence, the components P slip in relation to the carrying member M, so that only the carrying member M returns, and the components P remain at the front end position. Then, distance L is the amount of movement of the components P.

By repeating the operations of FIGS. 1A to 1C, the components P are lined up in one line while being intermittently carried forward. To facilitate explanation, FIGS. 1A to 1C showed a case where there is no relative slip between the carrying member M and the components P when advancing, and no frictional force acting between the carrying member M and the components P when returning, but there may acceptably be some slight slip when advancing, and some slight frictional force when returning. In any case, the difference in speed when advancing and returning need only be set such that, when the carrying member M repeatedly advances and returns, the components P advance by a predetermined distance each time.

Also, speed does not necessarily have to be constant throughout advancing and returning.

Further, the stop period at the transition from advancing to returning should preferably be as short as possible, and conversely, a stop period of a certain length should preferably be provided at the transition from returning to advancing. Consequently, it is possible to effectively utilize static frictional force when advancing.

In the present invention, the speed at which the frictional force substantially breaks does not signify only a speed at which no frictional force whatsoever is acting, but also includes speeds at which the components do not substantially return despite the action of some slight frictional force.

Alternatively, when the carrying member has on its top face a forward-facing portion which slopes downwards, the frictional force with the components breaks more easily when the carrying member returns, thereby improving carrying efficiency. Here, the angle of this slope must be sufficiently gentle so that the components mounted on the top face do not slip down of their own accord.

In order to make the top face of the carrying member forward-facing and downward-sloping, a carrying member with a downward-sloping top can be moved in a horizontal direction, or alternatively, a carrying member with a flat top face can be moved diagonally downward.

The arrangement may be such that the bottom end of a shoot groove is connected to the rear end of the guide groove, so that the components slide down in the shoot, and then, when the carrying member advances, a predetermined number of components are inserted into the guide groove, and in addition, the components in the guide groove are restricted from returning as the carrying member moves back, by a component which has stopped at the bottom of the shoot groove. In this case, since the components in the guide groove are restricted from returning by the component in the shoot groove, it is possible to reliably prevent the components from following the carrying member as it returns.

Preferably, the driving means comprises a spring for applying a rearward force to the carrying member, and a cam, rotated in a fixed direction and having a cam face which continuously contacts the carrying member, whereby driving means of simple constitution can be provided. That is, the crest of the cam face pushes the carrying member to move it forward, and the carrying member falls into the trough of the case face, as a result of the spring force, to move the carrying member backwards.

The driving means are not limited to the configuration of a spring and a cam, and a rack and pinion system, or a sloping cam system and the like may acceptably be used.

FIG. 2~FIG. 5 show an example of the component carrying device of the present invention. In this embodiment, a chip-like electronic component is for instance used as the components P.

Figure 2:
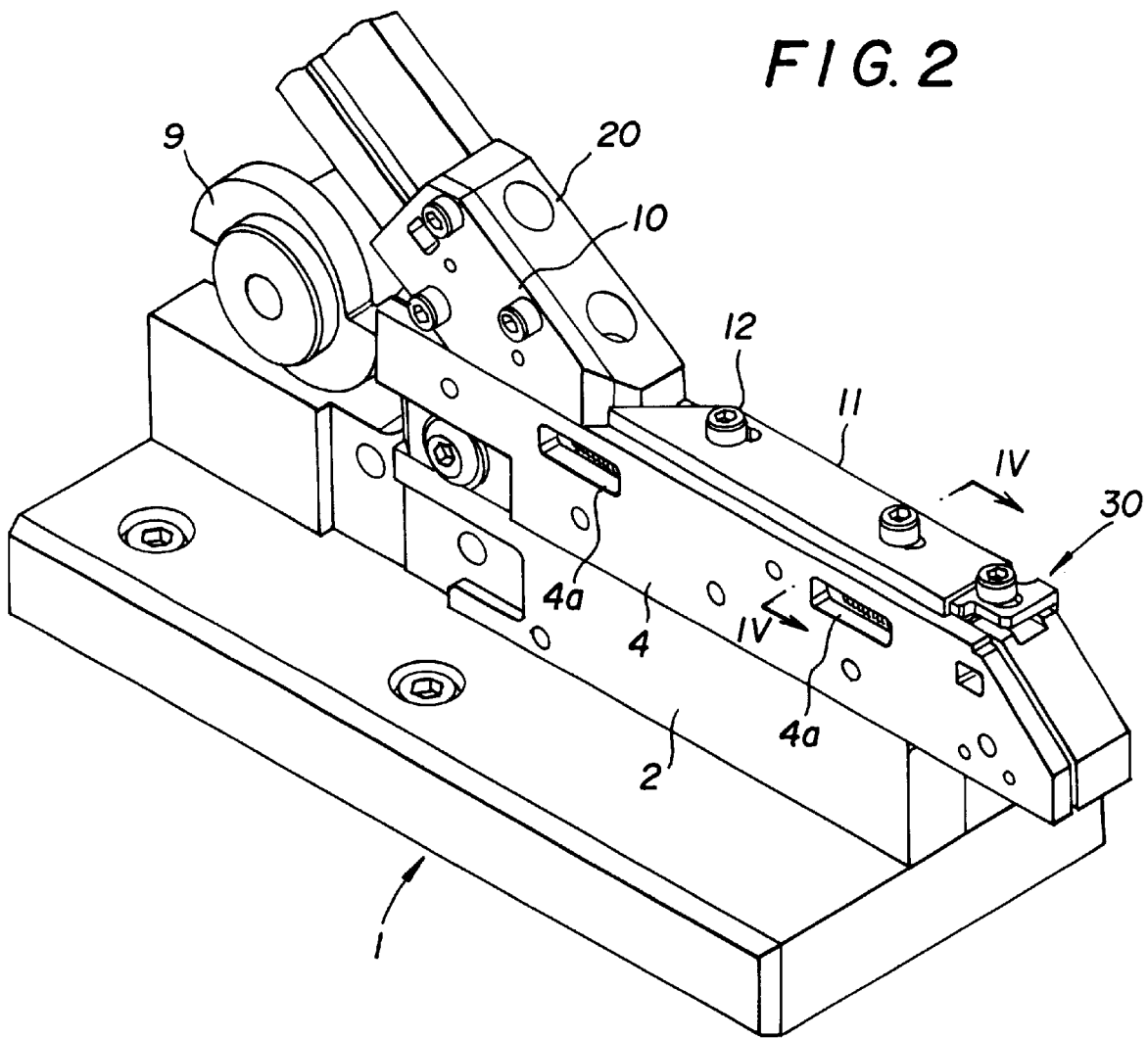
FIG. 2 is a perspective view of a first embodiment of the component carrying device of the present invention.
Figure 3:
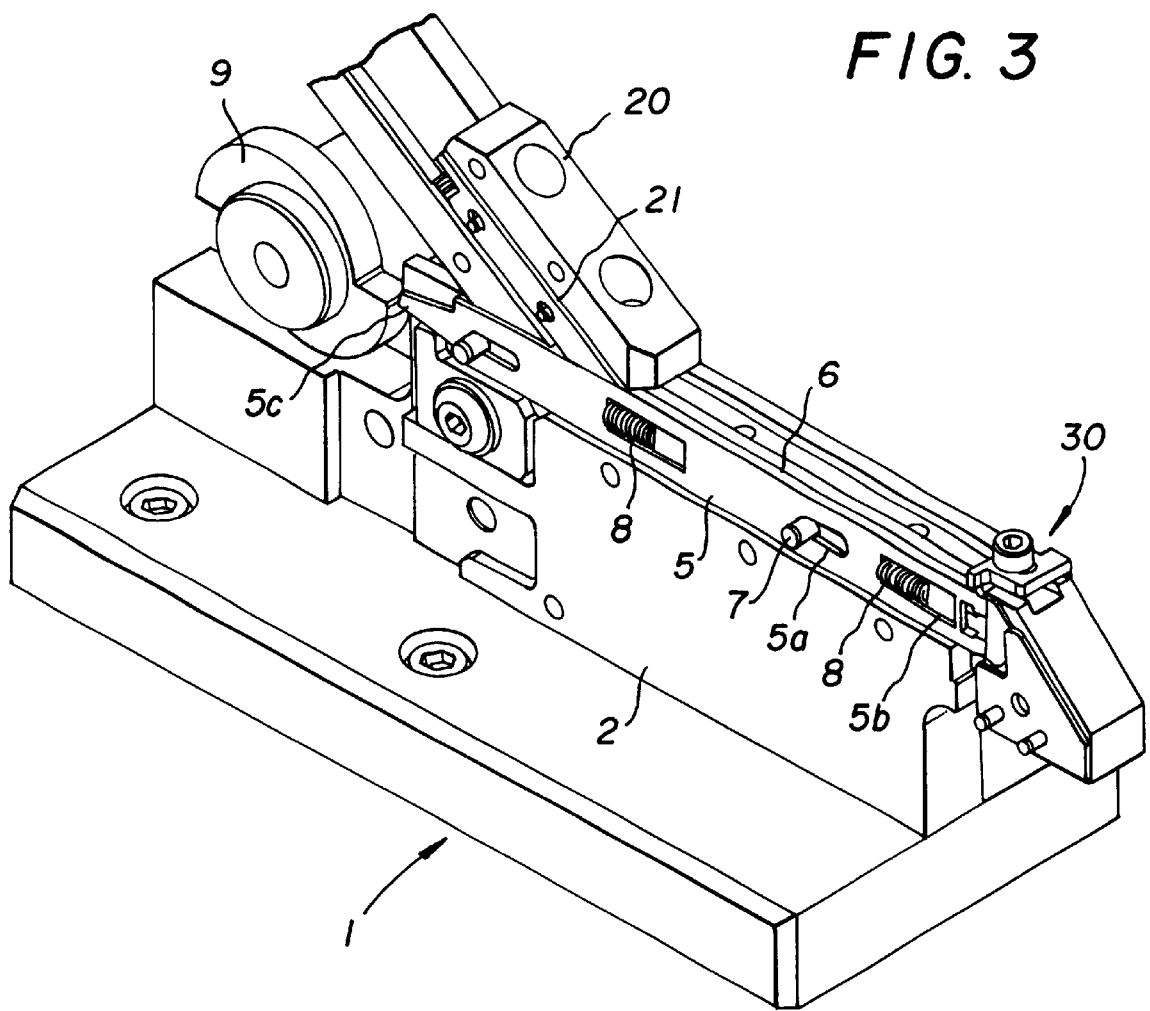
FIG. 3 is a perspective view of the component carrying device shown in FIG. 2 showing a state when the front face cover and the top face cover have been removed.

FIG. 2 shows an overall view of the present device, and FIG. 3, a state when the front face covers 4 and 10, and the top face cover 11 have been removed.

Figure 4:
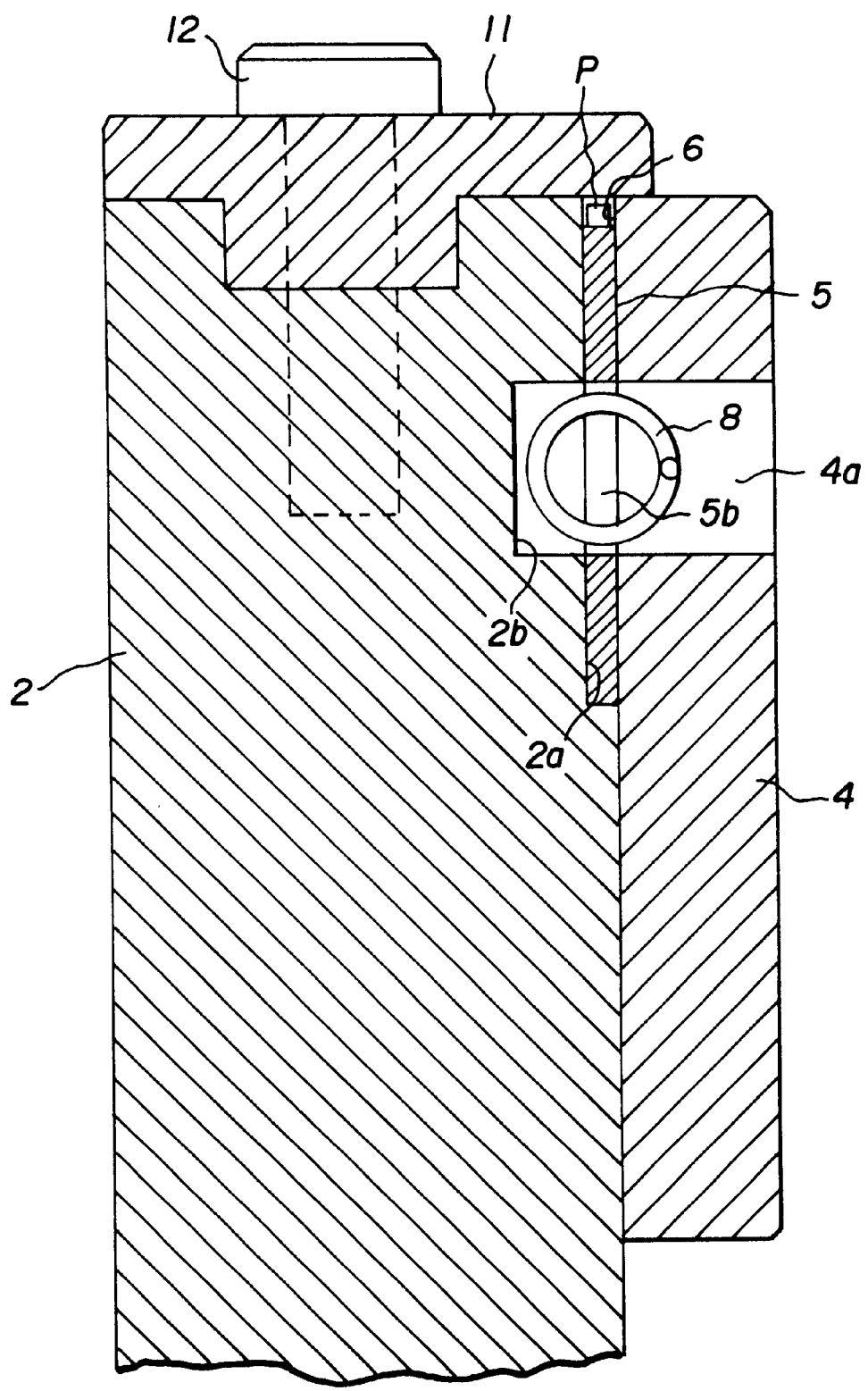
FIG. 4 is a cross-sectional view taken along the line IV—IV in FIG. 2.

As shown in FIG. 4, a concave step 2a is provided on the front face of a vertical wall 2 of a reverse T-shaped main body 1, and by securing a front face cover 4 to the front face of this vertical wall 2, a narrow space is formed. A blade 5, which constitutes one example of a carrying member, is provided in this space and is able to slide freely in the horizontal direction. A top face cover 11 is secured using a screw 12 to the top face of the vertical wall 2, thereby ensuring that the component P does not fly off during carrying. The inside face of the concave step 2a, the inside face of the front face cover 4, the top face of the blade 5 and the bottom face of the top face cover 11 together form a guide groove 6 in order to line the components P in one line.

As shown in FIG. 3, the blade S, which comprises a thin metal plate, has a long hole 5a and a spring storing hole 5b along its front-rear direction. A pin 7 projects from the vertical wall 2 and is inserted into the long hole 5a, and guides the blade S along the front-rear direction. Furthermore, a spring 8 is stored in the spring storing hole 5b, both side portions in the radial direction of this spring 8 being stored in a concave groove 2b, provided in the vertical wall 2, and an opening hole 4a (see FIG. 4), provided in the front face cover 4. Then, the rear face of the spring 8 is supported by the spring storing hole 5b, the front face thereof is supported by the front end faces of the concave groove 2b and the opening hole 4a, and the blade 5 is continually pushed rearward.

Figure 5:
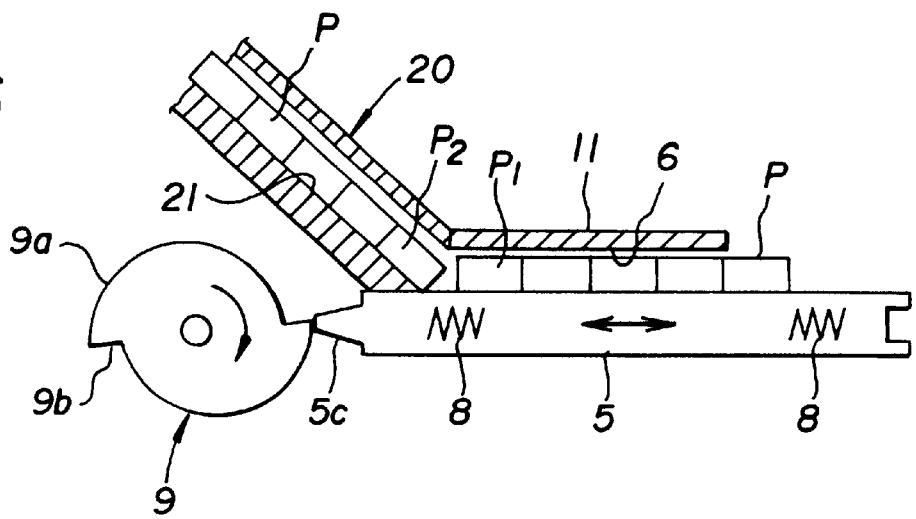
FIG. 5 is a cross-sectional view of a drive mechanism of the component carrying device shown in FIG. 2.

The rear end 5c of the blade 5 engages with the perimeter face of a cam 9, which is provided to the main body 1 so as to be freely rotatable against the spring force of the spring 8, the above spring 8 and cam 9 thereby comprising driving means for driving the blade 5 forwards and backwards. As shown in FIG. 5, the cam 9 has a crest 9a and a trough 9b, and is rotated in the arrow direction at constant speed by a motor (not shown in the diagram). As a consequence, when the rear end 5c of the blade 5 rises onto the crest 9a of the cam 9, the blade 5 advances at low speed, and when the rear end 5c falls into the trough 9b of the cam 9, the blade 5 returns at high speed. The advance speed of the above blade 5 is set to a speed at which a predetermined sustained frictional force acts between the blade 5 and the component P mounted on its top face, due to the rotation speed of the cam 9 and the slope of the crest 9a of the cam 9. Further, the return speed of the blade 5 is set to a speed which will substantially break the frictional force acting between the blade 5 and the components P mounted on its top face.

The principle of carrying the components P is the same as explained in FIGS. 1A to 1C, and therefore will be omitted here.

A line-up device 20 is diagonally secured on the upper face of the rear of the vertical wall 2 of the main body 1. The line-up device 20 has a shoot groove 21 for guiding the components P sliding down the slope. A front face cover 10 for covering the front face of this shoot groove 21 is secured thereto. The bottom end of the shoot groove 21 is connected to the rear end of the guide groove 6, so that components P which have slid down the shoot groove 21 then enter the guide groove 6. Now, due to the change in angle between the shoot groove 21 and the guide groove 6, a component P2, at the bottom end of the shoot groove 21, prevents the components P in the guide groove 6 from returning.

A separating mechanism 30 (which will not be explained in detail) is provided at the front end of the guide groove 6, and separates the head component of those carried from the second component and later components.

Here, the action of how a component in the shoot groove 21 prevents the components P in the guide groove 6 from returning will be explained using FIG. 5.

Firstly, when the blade 5 advances and the components P on top of the blade 5 are carried forward, a predetermined number of components P in the shoot groove 21 fit into the guide groove 6. If the motion pitch of the blade 5 corresponds to one component, the components P in the shoot groove 21 will be guided into the guide groove 6 one by one. Next, when the blade 5 returns at high speed, although relative slip occurs between the blade 5 and the component P, since a slight generation of frictional force between the blade 5 and the component P causes the component P to start to move back together with the blade 5. On the other hand, the component P in the shoot groove 21 maintains a fixed position, and therefore the rear end component P1 on the blade 5 strikes the component P2 which is in the bottom end of the shoot groove 21. Since the component P2 in the bottom end of the shoot groove 21 is positioned at an angle, it cannot not move backwards even if pushed back by the component P1. As a result, the component P in the guide groove 6 can be reliably prevented from returning. In this way, it is possible to reliably prevent returning caused by the component P in the shoot groove 21 without using a separate return-prevention mechanism, and consequently the conveying means is extremely simple.

Figure 6:
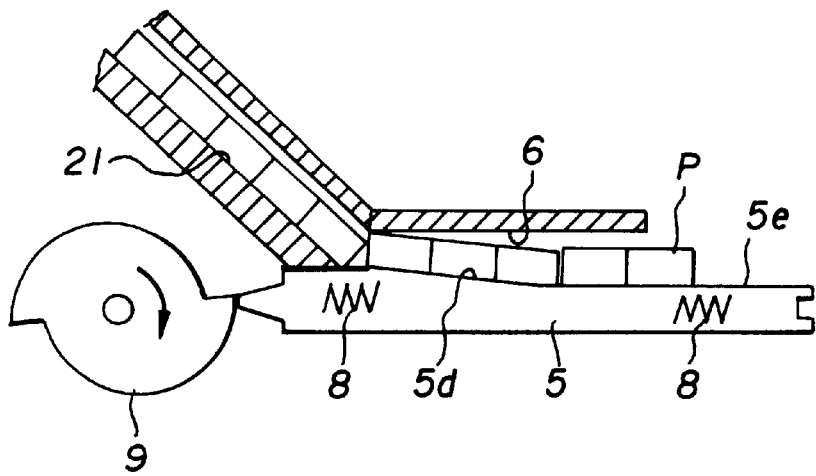
FIG. 6 is a cross-sectional view of another embodiment of a blade.

FIG. 6 shows a second embodiment of the present invention.

In this embodiment, a sloping face 5d, sloping downward to the front, is provided on the rear upper face of the blade 5. The angle of this sloping face 5d is more gentle than the shoot groove 21. According to this constitution, when the blade 5 moves forward, the frictional coefficient of the sloping face 5d is comparatively greater than the frictional coefficient of the flat top face 5e of the front portion, and therefore components P can be carried forward efficiently, and the component P can be prevented from following the blade 5 back when the blade 5 returns.

The sloping face 5d is not limited to one portion of the blade 5, and can acceptably be provided over the entire top face of the blade 5.

Figure 7:
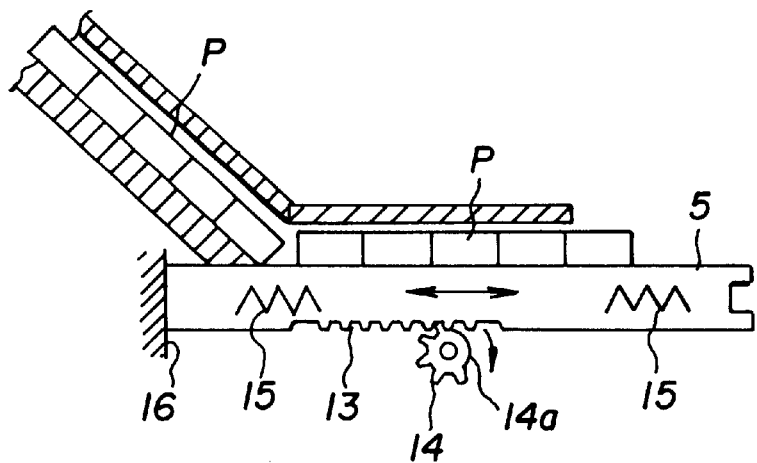
FIG. 7 is a cross-sectional view of another embodiment of a drive mechanism.

FIG. 7 shows a third embodiment of the present invention.

In the embodiments already described, the driving means comprised a spring 8 and a cam 9, but in this embodiment, a rack is provided in the blade 5, and in addition, a pinion 14, having teeth which mesh with the rack 13 and a gap in the teeth 14a, is provided. Here, there is provided a spring 15, for forcing the blade 5 backward, and a stopper 16 for restricting the rear end position of the blade 5 is provided on the main body 1.

When the driving means has this constitution, by rotating the pinion 14 in a clockwise direction, the blade 5 advances at low speed, and when the gap in the teeth 14a of the pinion 14 correspond to the rack 13, the mesh between the pinion and the rack is removed, whereby the spring 15 causes the blade 5 to move back at high speed, strike the stopper 16 and stop.

The driving means are not limited to the configuration of a spring 8 and a cam 9, as shown in FIG. 5, or to the configuration of a rack 13 and a pinion 14, as shown in FIG. 7, and a variety of mechanisms can be employed. The drive source does not have to be a rotating mechanism such as a motor, and can acceptably be a linear mechanism.

Furthermore, the above embodiments described an example where the blade 5 was provided horizontally and driven horizontally, but the top face of the blade 5 may be flat, and the blade 5 itself can be moved forwards down a gentle slope and along the angle of this slope. In this case, the same effects as FIG. 6 are obtained.

Moreover, the carrying member is not limited to a blade, and any type of member may be used wherein a guide groove can be formed in the bottom face and which can be moved forward and backward. However, when a thin member such as a blade is used, it can be made lightweight, and effects of inertia while moving forwards and backwards can be reduced.

The component carried by the present invention is not limited to a chip component, and any kind of component which can be lined up in a guide groove and carried may be used.

As is clear from the above explanation, according to the component carrying device of the present invention, there is a difference in speeds of conveying (advancing) and withdrawing (returning) the carrying member, the difference in frictional force enabling components to be carried in one direction, and consequently the components do not need to be restrained and suffer little damage. Further, there is no danger of the components snagging midway due to dirt on the components or static electricity, ensuring high reliability.

Furthermore, since it is not necessary to use a flexible material, such as a belt. The carrying member can use a hard material, such as metal. Consequently, rigidity of the carrying member can be increased, achieving excellent durability.

Moreover, since the carrying member is only driven forwards and backwards, the drive mechanism can be made simply and cheaply, and in addition, high-speed carrying is made possible, rather than the intermittent carrying of the conventional technology, with few breakdowns.

The present invention has been described by reference to specific embodiment to which is it not limited. Modifications and variations will occur to those skilled in the art without departing from the spirit and scope of the present invention, the metes and bounds of which are set forth in the claims appended hereto.

What is claimed is:

1. A component carrying device comprising:
   a guide groove for axially lining up components into one line and guiding them;
   a substantially horizontal carrying member, provided on an open bottom of said guide groove, and movable forward and backward along said axial direction thereof; and
   driving means, for advancing said components by driving said carrying member forward and backward, the speed when moving backward being higher than when moving forward,
   wherein the speed of said carrying member when moving forward is a speed at which a predetermined sustained frictional force acts between said carrying member and said components, which are on a top face of said carrying member; and
   wherein the speed of said carrying member when moving backward is a speed at which the frictional force between said carrying member and said components, on said top face thereof, is substantially overcome.

2. The component carrying device according to claim 1, wherein said driving means comprises a spring for applying a rearward force to said carrying member; and a cam, rotatably driven in a fixed direction and having a cam face which continuously contacts said carrying member.

3. The component carrying device according to claim 1, further comprising a cover covering said guide groove.

4. The component carrying device according to claim 1, further comprising a cover covering said shoot groove.

5. The component carrying device according to claim 1, wherein said speeds of said carrying member when moving forward and backward are set such that when the carrying member repeatedly advances and returns, the components advance by a predetermined distance each cycle of forward and backward motion.

6. The component carrying device according to claim 1, wherein said driving means comprises a spring for applying a rearward force to said carrying member, a rack provided in the carrying member, and a pinion having teeth which mesh with the rack and a gap in the teeth.

7. The component carrying device according to claim 1, wherein a bottom end of a shoot groove is connected to a rear end of said guide groove, a predetermined number of components which have slid down the shoot groove entering said guide groove when said carrying member advances, and in addition, the components in the guide groove are restricted from returning with said carrying member by a component stopped at the bottom end of the shoot groove.

8. The component carrying device according to claim 7, wherein said driving means comprises a spring for applying a rearward force to said carrying member; and a cam, rotatably driven in a fixed direction and having a cam face which continuously contacts said carrying member.

9. The component carrying device according to claim 7, wherein said driving means comprises a spring for applying a rearward force to said carrying member, a rack provided in the carrying member, and a pinion having teeth which mesh with the rack and a gap in the teeth.

10. The component carrying device according to claim 1, wherein said carrying member has a sloping portion, which slopes down toward a front portion, on its top face.

11. The component carrying device according to claim 10, wherein said driving means comprises a spring for applying a rearward force to said carrying member, a rack provided in the carrying member, and a pinion having teeth which mesh with the rack and a gap in the teeth.

12. The component carrying device according to claim 10, wherein said driving means comprises a spring for applying a rearward force to said carrying member; and a cam, rotatably driven in a fixed direction and having a cam face which continuously contacts said carrying member.

13. The component carrying device according to claim 10, wherein a bottom end of a shoot groove is connected to a rear end of said guide groove, a predetermined number of components which have slid down the shoot groove entering said guide groove when said carrying member advances, and in addition, the components in the guide groove are restricted from returning with said carrying member by a component stopped at the bottom of the shoot groove.

14. The component carrying device according to claim 13, wherein said driving means comprises a spring for applying a rearward force to said carrying member; and a cam, rotatably driven in a fixed direction and having a cam face which continuously contacts said carrying member.

15. The component carrying device according to claim 13, wherein said driving means comprises a spring for applying a rearward force to said carrying member, a rack provided in the carrying member, and a pinion having teeth which mesh with the rack and a gap in the teeth.

* * * * *